(12) United States Patent
Graham et al.

(10) Patent No.: US 11,815,812 B2
(45) Date of Patent: Nov. 14, 2023

(54) PHOTORESIST FORMULATION

(71) Applicant: Funai Electric Co., Ltd., Osaka (JP)

(72) Inventors: David C. Graham, Lexington, KY (US); Joel P. Provence, Delaware, OH (US); Sean T. Weaver, Lexington, KY (US); Richard D. Wells, Westerville, OH (US)

(73) Assignee: Funai Electric Co., Ltd.

( * ) Notice: Subject to any disclaimer, the term of this patent is extended or adjusted under 35 U.S.C. 154(b) by 86 days.

(21) Appl. No.: 17/538,384

(22) Filed: Nov. 30, 2021

(65) Prior Publication Data
US 2023/0168580 A1    Jun. 1, 2023

(51) Int. Cl.
*G03F 7/031* (2006.01)
*G03F 7/09* (2006.01)
*H01L 21/027* (2006.01)

(52) U.S. Cl.
CPC .............. *G03F 7/031* (2013.01); *G03F 7/094* (2013.01); *H01L 21/0274* (2013.01)

(58) Field of Classification Search
CPC ....... G03F 7/031; G03F 7/094; H01L 21/0274
See application file for complete search history.

(56) References Cited

U.S. PATENT DOCUMENTS

| | | | |
|---|---|---|---|
| 8,394,575 B2 | 3/2013 | Wu et al. | |
| 9,857,685 B2 * | 1/2018 | Imaizumi | G03F 7/0758 |
| 2005/0260522 A1 | 11/2005 | Weber et al. | |
| 2014/0302430 A1 | 10/2014 | Nawrocki et al. | |
| 2017/0299965 A1 * | 10/2017 | Hashimoto | H01L 29/786 |
| 2021/0011382 A1 | 1/2021 | Weaver | |
| 2021/0024773 A1 * | 1/2021 | Tokunaga | H01L 21/0332 |

OTHER PUBLICATIONS

A del Campo and C Greiner, SU-8: a photoresist for high-aspect-ratio and 3D submicron lithography, 2007, Journal of Micromechanics and Microengineering, 17, R81-R-95 (Year: 2007).*

* cited by examiner

*Primary Examiner* — Mark F. Huff
*Assistant Examiner* — Andrew Preston Traywick
(74) *Attorney, Agent, or Firm* — Luedeka Neely, P.C.

(57) ABSTRACT

A planarization layer and method therefor. The planarization layer has a thickness ranging from about 2 to about 3 microns, and contains from about 8.0 to about 8.5 wt. % photoacid generator; from about 2 to about 3.6 wt. % photoinitiator; from about 0.35 to about 0.5 wt. % green dye; from about 35 to about 46 wt. % multifunctional epoxy compound; from about 35 to about 50 wt. % of one or more difunctional epoxy compounds; and from about 1 to about 2.6 wt. % silane adhesion promoter, wherein all weight percent is based on a total weight of the layer devoid of solvent.

20 Claims, 6 Drawing Sheets

PHOTORESIST FORMULATION

TECHNICAL FIELD

The invention relates to an improved photoresist formulation for a fluid jet ejection device and to a method for improving a planarization layer for a fluid jet ejection head.

BACKGROUND AND SUMMARY

Fluid jet ejection devices continue to evolve as the technology and use of fluid jet ejection heads expands into a variety of applications beyond ink jet printing applications. An important component of the fluid jet ejection devices is the fluid jet ejection head. Proper operation of the jet ejection head requires that the components of the ejection head be precisely manufactured and positioned relative to one another. For example, the alignment tolerance between a nozzle plate and semiconductor chip components of the ejection head are critical to the proper functioning of the ejection head.

During the manufacture of a jet ejection head, nozzle plates are aligned with semiconductor chips on the wafer so that fluid ejection devices on the semiconductor chip used for ejecting fluid through nozzle holes in the nozzle plate align with the nozzle holes. Misalignment between the fluid ejection devices and the nozzle holes has a disadvantageous effect on the accuracy of fluid droplet placement ejected from the nozzle holes. Fluid ejection device and nozzle plate alignment also has an effect on the mass and velocity of the fluid droplet ejected through the nozzle holes.

There are multiple manufacturing steps required to produce fluid jet ejection head. First resistive, conductive and insulative metal layers are deposited on a silicon wafer to define individual semiconductor chips. Some of the layers, such as the resistive layers are disposed on discrete locations on each chip. Accordingly, the surface of the chips, on a microscopic scale, is substantially irregular or non-planar. The irregularities on the chip surface may cause poor adhesion between the nozzle plate and chip, misalignment of the nozzle holes in the nozzle plate with respect to the fluid ejection devices on the semiconductor chip, or in the worst case, delamination between the nozzle plate and chip.

Once the conductive, resistive and insulative layers are deposited on the wafer, and individual chips are defined, individual nozzle plates are attached to the chips after aligning the nozzle plates and chips to one another. The nozzle plate/chip assembly is then excised from the wafer and a tape automated bonding (TAB) circuit or flexible circuit is then electrically connected to each of the semiconductor chips using a wire bonding or TAB process. Each of the resulting nozzle/plate chip and circuit assemblies are then attached to a cartridge body in a chip pocket thereon using a die bond adhesive. Finally, the TAB circuit or flexible circuit portion of the assembly is adhesively attached to the cartridge body. Because of the multiple adhesives used for making the fluid jet ejection head, there are typically several curing steps required during the assembly of the ejection head components. With each assembly and curing step there is an opportunity for component misalignment to occur. Furthermore, handling of the ejection head during the assembly steps may cause delamination between the nozzle plates and chips.

A planarization layer may be used to increase bonding between the nozzle plate and the semiconductor chip. The planarization layer may be a photoresist material layer that is imaged and processed to expose the fluid ejection devices. However, due to the reflectivity of the metal layers deposited on the chip, it is difficult to properly image and develop the conventional photoresist material resulting in incomplete removal of the material from critical areas of the semiconductor chip. Accordingly, there remains a need for an improved photoresist formulation for use as a planarization layer for attaching a nozzle plate to a semiconductor chip.

With regard to the foregoing an embodiment of the disclosure provides a planarization layer and a method therefor. The planarization layer has a thickness ranging from about 2 to about 3 microns and includes from about 8.0 to about 8.5 wt. % photoacid generator based on a total weight of the layer devoid of solvent; from about 2 to about 3.6 wt. % photoinitiator based on a total weight of the layer devoid of solvent; from about 0.35 to about 0.5 wt. % green dye based on a total weight of the layer devoid of solvent; from about 35 to about 46 wt. % multifunctional epoxy compound based on a total weight of the layer devoid of solvent; from about 35 to about 50 wt. % of one or more difunctional epoxy compounds based on a total weight of the layer devoid of solvent; and from about 1 to about 2.6 wt. % silane adhesion promoter based on a total weight of the layer devoid of solvent.

In another embodiment, there is provided a method for planarizing a semiconductor chip for a fluid ejection head. The method includes spin-coating a photoresist formulation onto a device surface of the semiconductor chip to provide a planarization layer having a thickness ranging from about 2 to about 3 microns. The planarization layer is dried to remove solvent therefrom and then exposed to actinic radiation through a mask. The exposed planarization layer is developed in order to define fluid ejector locations in the planarization layer and finally baked to cure the planarization layer. The photoresist formulation includes from about 3.5 to about 4.5 wt. % photoacid generator based on a total weight of the formulation; from about 0.8 to about 1.8 wt. % photoinitiator based on a total weight of the formulation; from about 0.15 to about 0.25 wt. % green dye based on a total weight of the formulation; from about 15 to about 20 wt. % multifunctional epoxy compound based on a total weight of the formulation; from about 15 to about 25 wt. % one or more difunctional epoxy compounds based on a total weight of the formulation; from about 0.5 to about 1.3 wt. % silane adhesion promoter based on a total weight of the formulation; and the balance solvent.

In some embodiments, the one or more difunctional epoxy compounds are selected from compounds of the formulas:

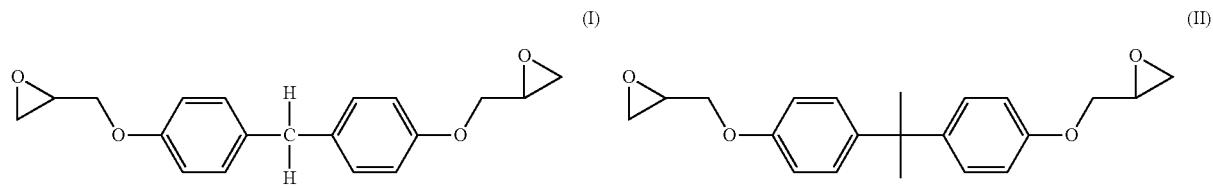

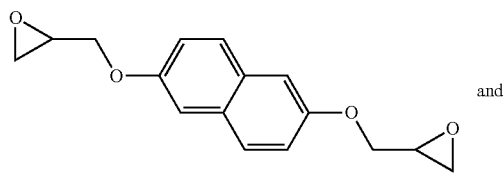
(III)

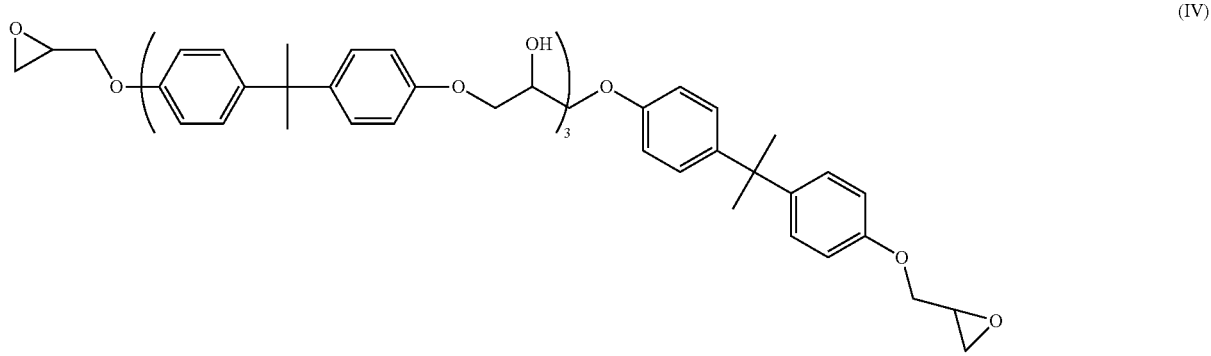
(IV)

In some embodiments, the multifunctional epoxy compound is selected from compounds of the formulas:

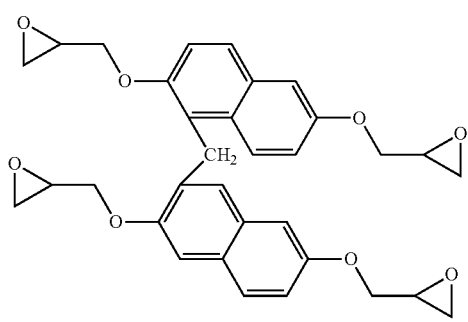
(V)

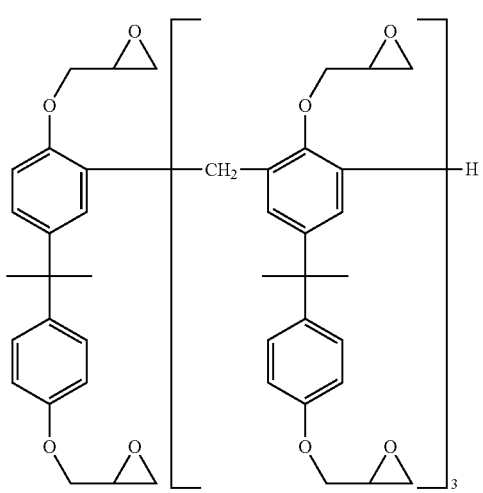
(VI)

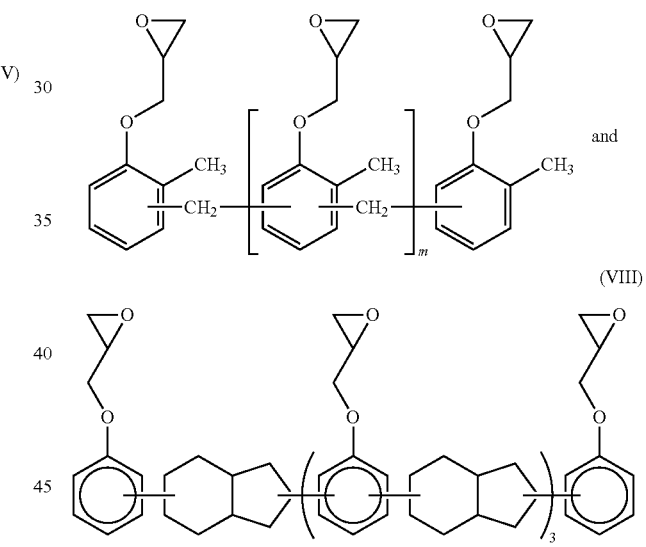
(VII) and (VIII)

wherein m, n, and p are integers representing the number of repeat units in each of the polymers.

In some embodiments, the one or more difunctional epoxy compounds includes from about 3.5 to about 4.6 wt. % based on a total weight of the layer devoid of solvent of a compound of the formula:

(III)

wherein the compound of formula (III) has an epoxy equivalent weight of about 140 grams per mole, and from about 35 to about 46 wt. % based on a total weight of the layer devoid of solvent of a compound of the formula:

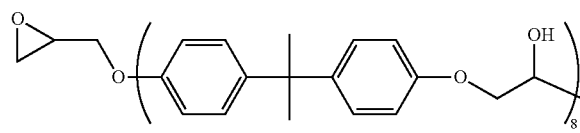
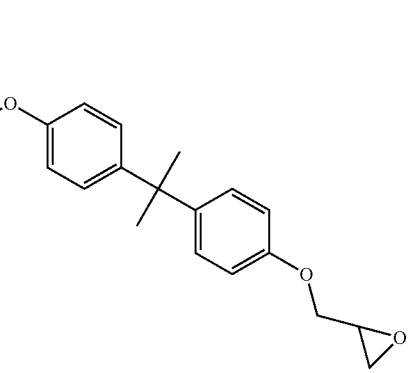

(V)

wherein the compound of formula (V) has an epoxy equivalent weight of about 1700 to about 2300 grams per mole.

In some embodiments, the multifunctional epoxy compound includes from about 35 to about 46 wt. % based on a total weight of the layer devoid of solvent of a compound of the formula:

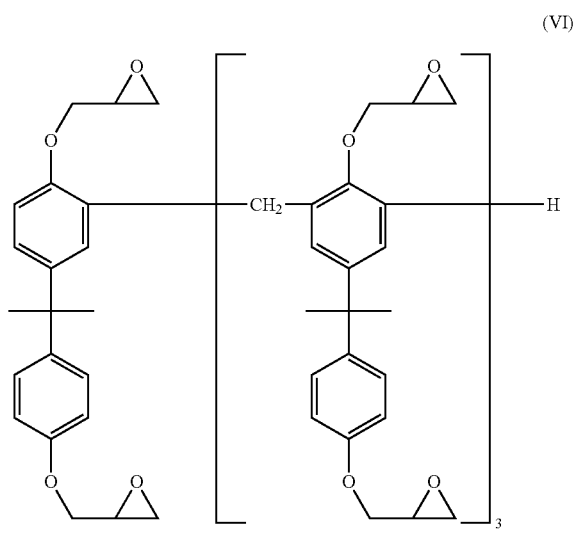

(VI)

wherein the compound of formula (VI) has an epoxy equivalent weight of about 195 to about 230 grams per mole.

In some embodiments, the silane adhesion promoter is 3-glycidoxypropyltrimethoxysilane.

In some embodiments, the green dye is a powdered green metal complex dye.

In some embodiments, the photoinitiator is 2-isopropylthioxanthone.

In some embodiments, the photoacid generator is a compound or mixture of compounds capable of generating a cation such as an aromatic complex salt which may be selected from onium salts of a Group VA element, onium salts of a Group VIA element, and aromatic halonium salts.

In some embodiments, the solvent is selected from gamma-butyrolactone, acetophenone, and mixtures thereof.

In some embodiments, there is provided a semiconductor chip for a fluid ejection head that includes a planarization layer made by spin-coating a photoresist formulation onto a device surface of the semiconductor chip to provide a planarization layer having a thickness ranging from about 2 to about 3 microns. The planarization layer is dried to remove solvent therefrom and then exposed to actinic radiation through a mask. The exposed planarization layer is developed in order to define fluid ejector locations in the planarization layer and finally baked to cure the planarization layer. The photoresist formulation includes from about 3 to about 5 wt. % photoacid generator based on a total weight of the formulation; from about 0.8 to about 1.8 wt. % photoinitiator based on a total weight of the formulation; from about 0.15 to about 0.25 wt. % green dye based on a total weight of the formulation; from about 15 to about 20 wt. % multifunctional epoxy compound based on a total weight of the formulation; from about 15 to about 25 wt. % one or more difunctional epoxy compounds based on a total weight of the formulation; from about 0.5 to about 1.3 wt. % silane adhesion promoter based on a total weight of the formulation; and the balance solvent.

An advantage of the compositions and method according to the disclosed embodiments is a decrease in metal reflectivity, and an increase in the process window during imaging and developing a planarization layer for an ejection head. The increased process window enables an increase of alignment of a mask to the semiconductor chip for defining ejection head features in the planarization layer for multiple semiconductor chips on a wafer. Accordingly, the formulation and method described herein was effective in increasing the processability of wafers containing semiconductor chips for ejection heads.

For purposes of the disclosure, "difunctional epoxy materials" means materials having only two epoxy functional groups in the compound. "Multifunctional epoxy materials" means epoxy materials having more than two epoxy functional groups in the compound.

BRIEF DESCRIPTION OF THE DRAWINGS

Further advantages of the invention will become apparent by reference to the detailed description when considered in conjunction with the figures, which are not to scale, wherein like reference numbers indicate like elements through the several views, and wherein.

DETAILED DESCRIPTION

Figure 1:
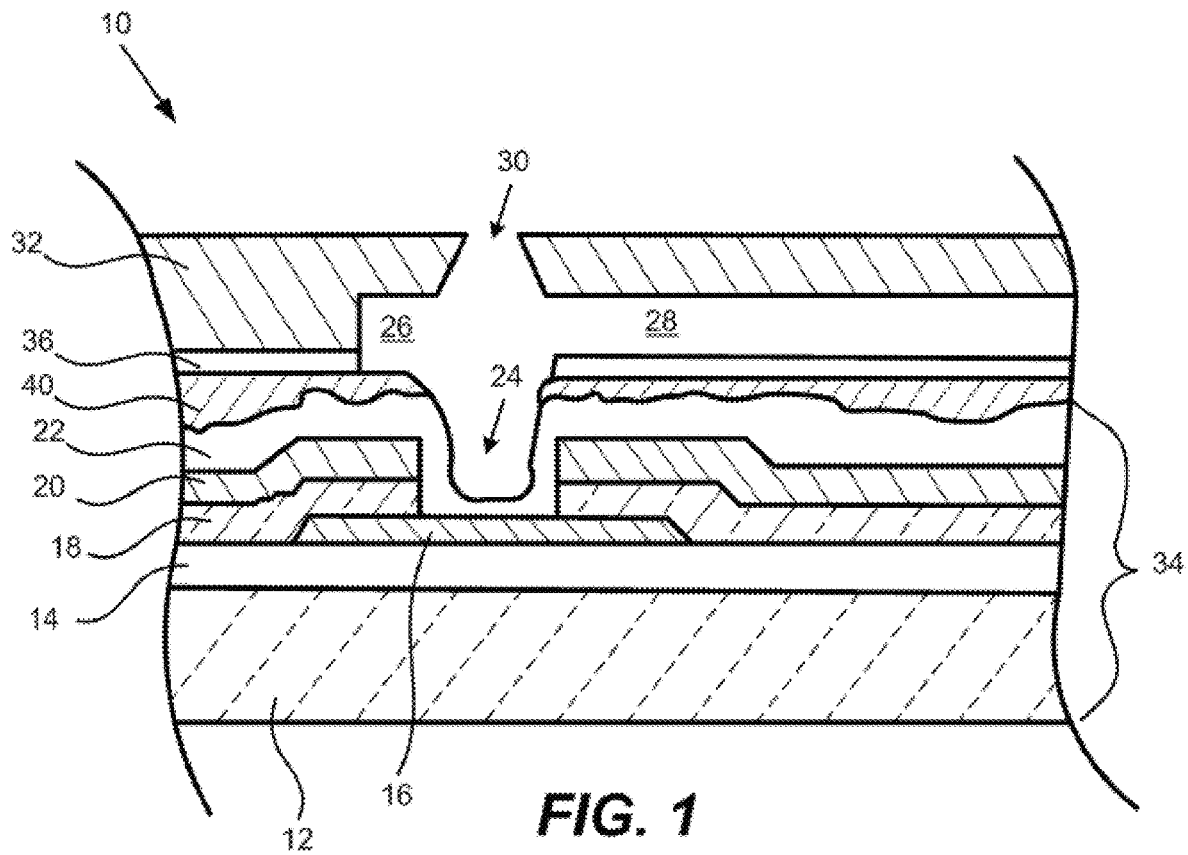
FIG. 1 is a cross-sectional view not to scale of a portion of a fluid ejection head according to the disclosure.

With regard to embodiments of the disclosure, fluid ejection heads have been made with a variety of photoresist layers attached to a silicon substrate. In order to improve the assembly and operation of the fluid ejection heads, imaging of flow features within the photoresist layers is a critical step for aligning fluid ejection devices with fluid chamber and fluid ejection nozzles. According to the present embodiment, a nozzle plate containing flow features such as a fluid chamber, fluid supply channel and nozzle hole is laminated to a semiconductor substrate containing the fluid ejection devices. A cross-sectional view, not to scale, of a portion of an ejection head 10 according to the disclosure is illustrated in FIG. 1. The ejection head 10 includes a silicon substrate 12, that contains a silicon dioxide passivation layer 14, a resistive layer 16 preferably of aluminum and copper or other resistive metal such as beta-phase tantalum, a conductive layer 18 such as alpha-phase tantalum, gold or the like, a passivation layer 20 such as silicon carbide and/or silicon nitride and a cavitation layer 22 of tantalum. In the embodiment shown in FIG. 1, the fluid ejection device is a heater resistor 24 that heats fluid supplied to an ejection chamber 26 from a fluid supply channel 28. The supply channel 28 and supply chamber 26 as well as the ejection nozzle 30 are all formed in a nozzle plate 32 that is heat laminated to the semiconductor substrate 34 by means of an adhesive 36. A suitable nozzle plate 32 is made of a polyimide film containing a phenolic adhesive 36 on one surface thereof. The nozzle plate 32 and adhesive 36 are laser ablated to form the fluid chambers 26, fluid supply channels 28 and nozzle holes 30 therein.

Figure 2:
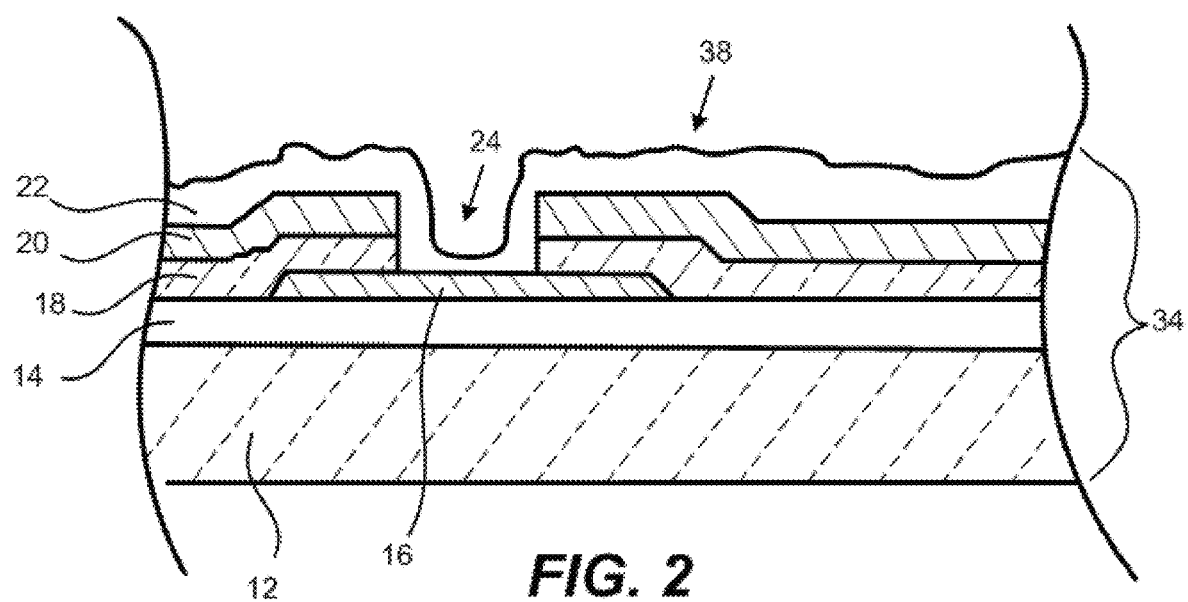
FIG. 2 is a cross-sectional view not to scale of a portion of a fluid ejection head of FIG. 1 before applying a planarization layer to a cavitation layer on a semiconductor substrate.
Figure 3:
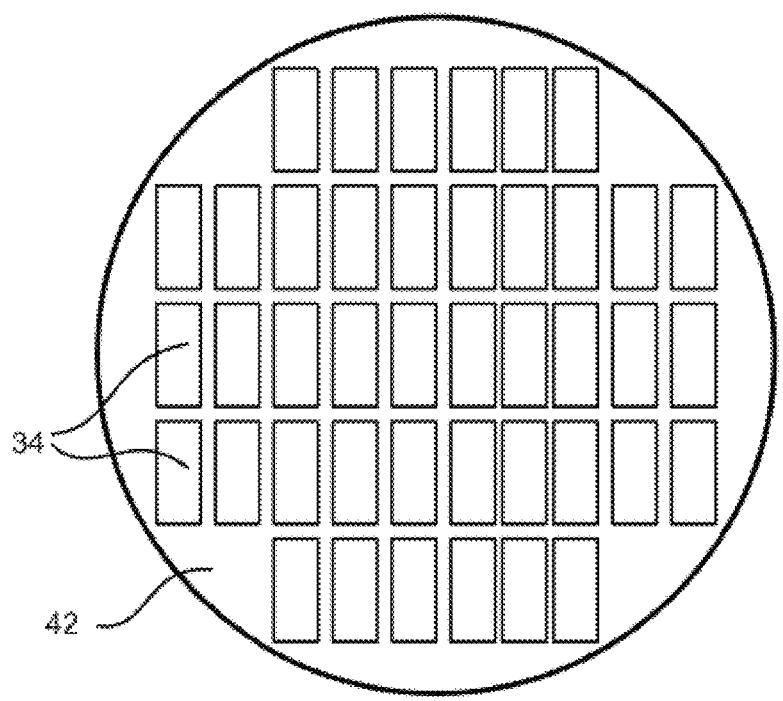
FIG. 3 is a plan view, not to scale, of a wafer containing a plurality of semiconductors substrates thereon.
Figure 4:
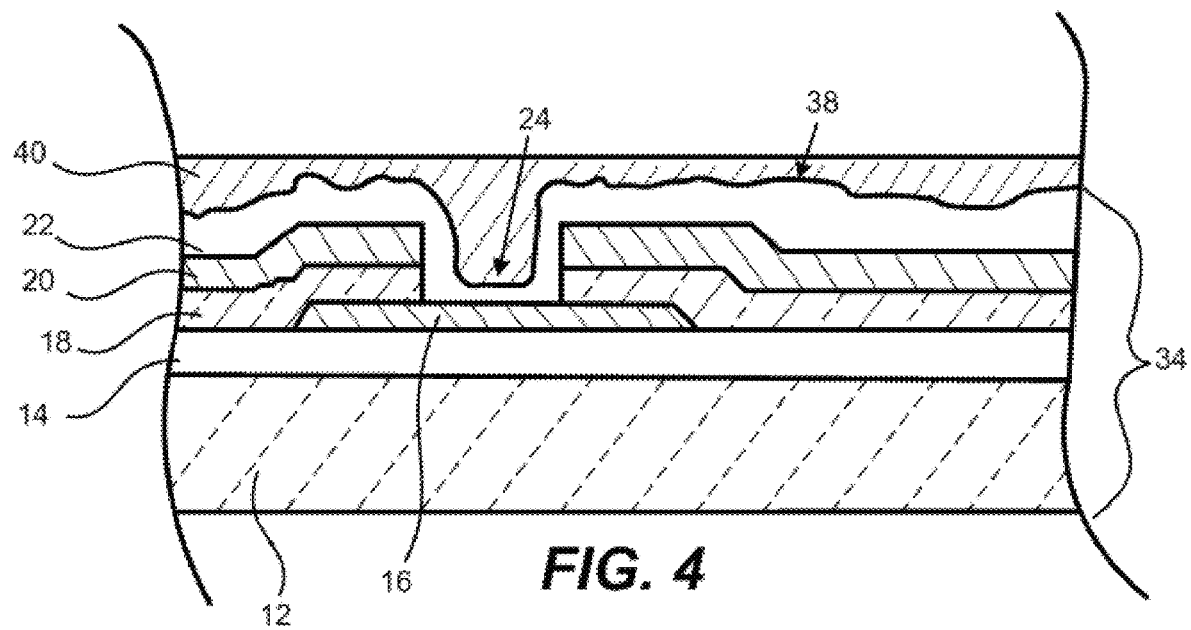
FIGS. 4-6 illustrate a process for making a fluid ejection head containing a planarization layer according to the disclosure.
Figure 5:
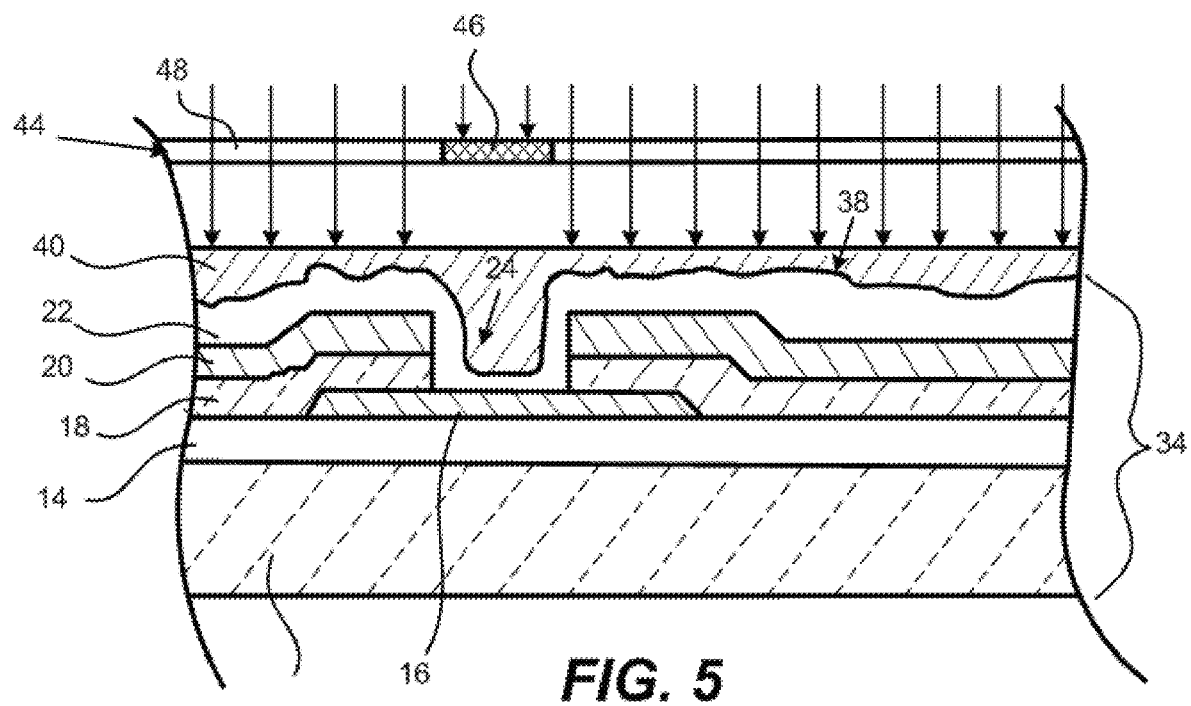

As seen in FIG. 2, an exposed surface 38 of the semiconductor substrate 34 is not smooth once all of the passivation, insulation and conductor layers have been applied to the silicon substrate. If the nozzle plate 32 is applied directly to the rough surface of the semiconductor substrate 34, delamination of the nozzle plate from the semiconductor substrate 34 may occur. Accordingly, a planarization layer 40 is preferably used to provide a smooth surface for lamination of the nozzle plate 32 to the semiconductor substrate 34. The planarization layer 40 is applied to the exposed surface 38 of the semiconductor substrate 34. A silicon wafer 42 (FIG. 3) is typically used to provide a plurality of semiconductor substrates 34 thereon.

According to an exemplary procedure for applying the planarization layer 40 to the exposed surface 38 of the semiconductor substrates 34, a non-photoreactive solvent and one or more difunctional epoxy compounds are mixed together in a suitable container such as an amber bottle or flask and the mixture is put in a roller mill overnight at about 60° C. to assure suitable mixing of the components. After mixing the solvent and difunctional epoxy compounds, a multifunctional epoxy compound is added to the container and the resulting mixture is rolled for two hours on a roller mill at about 60° C. The other components are also added one at a time to the container and the container is rolled for about two hours at about 60° C. after adding each component to the container to provide a wafer coating mixture. The resulting photoresist mixture may also contain various additives such as conventional fillers (e.g., barium sulfate, talc, glass bubbles) viscosity modifiers (e.g., pyrogenic silica), pigments, etc. These fillers may be used to control the viscosity of the mixture for spin-coating onto the wafer 42.

In order to apply the photoresist formulation to the surface 38 to planarize surface 38, the silicon wafer 42 is centered on an appropriate-sized chuck of either a resist spinner or conventional wafer resist deposition track. The photoresist formulation is either dispensed by hand or mechanically into the center of the wafer 42. The chuck holding the wafer 42 is then rotated at a predetermined number of revolutions per minute to evenly spread the photoresist formulation from the center of the wafer to the edge of the wafer 42. The rotational speed of the wafer may be adjusted, or the viscosity of the photoresist formulation may be altered to vary the resulting resin film thickness. Rotational speeds of 2500 rpm or more may be used. The amount of photoresist formulation applied to surface 38 should be sufficient to substantially planarize the surface 38. Accordingly, the thickness of the planarization layer 40 may vary depending on the actual surface irregularity to be planarized. A layer 40 thickness ranging from about 1 to about 5 microns is generally sufficient for most surfaces 38. A typical layer 40 thickness ranges from about 2 to about 3 microns.

The resulting coated silicon wafer 42 is then removed from the chuck either manually or mechanically and placed on either a temperature controlled hotplate or in a temperature controlled oven at a temperature of about 90° C. for about 30 seconds to about 1 minute until the material is "soft" baked. The baking step removes at least a portion of the solvent from the planarization layer 40 resulting in a partially dried film on the surface 38. The silicon wafer 42 is then removed from the heat source and allowed to cool to room temperature.

In order to define patterns in the planarization layer 40 such as the ejection device locations 24, and the bond pad locations 50, the planarization layer 40 is masked, exposed to a radiation source. A suitable mask 44 containing opaque areas 46 and transparent areas 48 is used to exposed portions of the planarization layer 40 to a radiation source to image the planarization layer 40 in order to define the locations for the fluid ejection devices 24 and bond pads 50 (FIG. 7) used to make electrical connections to the semiconductor substrate 34. Curing of the planarization layer 40 occurs on exposure of the photoresist formulation to actinic radiation at a wavelength within the ultraviolet and visible spectral regions. Exposures may be from less than about 1 second to 10 minutes or more, preferably about 5 seconds to about one minute, depending upon the amounts of particular epoxy materials and aromatic complex salts being utilized and depending upon the radiation source and distance from the source and the thickness of the layer 40 to be cured. The planarization layer 40 may also be cured by exposure to electron beam irradiation. This procedure is similar to a standard semiconductor lithographic process. After exposure, the planarization layer 40 is baked at a temperature of about 90° C. for about 30 seconds to about 10 minutes, preferably from about 1 to about 5 minutes to complete curing of the planarization layer 40.

Figure 6:
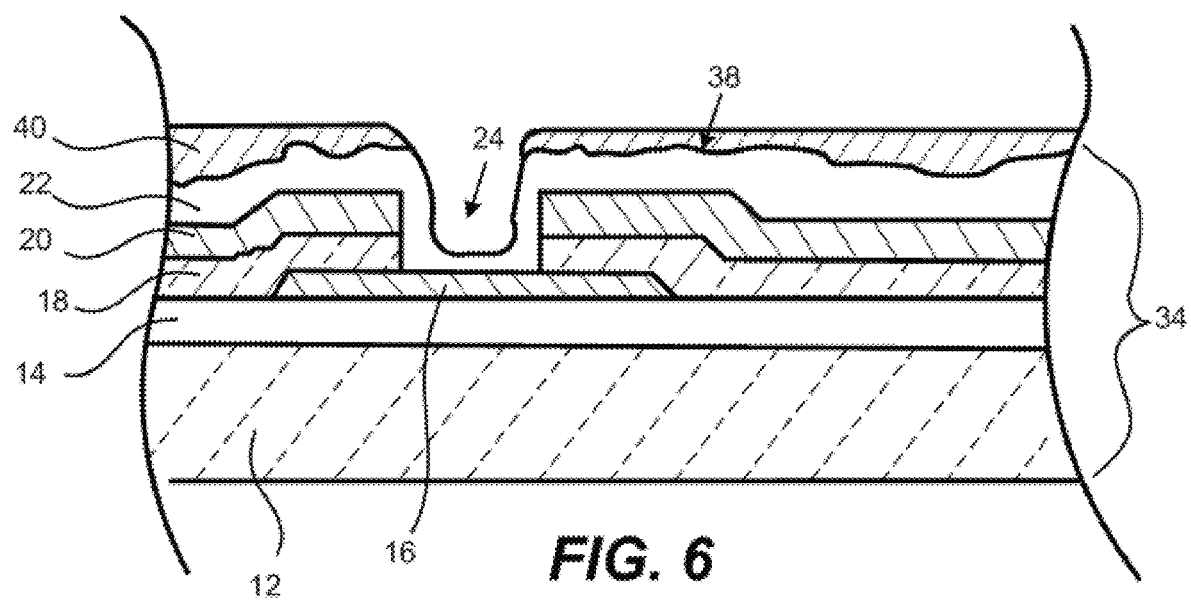

The areas of the planarization layer 40 that are not exposed to actinic radiation under the opaque areas 46 of the mask 44 are removed in a developing process from the planarization layer 40 as shown in FIG. 6. The developer comes in contact with the silicon wafer 42 through either immersion and agitation in a tank-like setup or by spray. Either spray or immersion of the wafer 42 will adequately remove the excess material as defined by the photo masking and exposure. Illustrative developers include, for example, butyl cellosolve acetate, a xylene and butyl cellosolve acetate mixture and $C_{1-6}$ acetates like butyl acetate. After developing the planarization layer 40, the wafer 42 is optionally baked at temperature ranging from about 150° C. to about 200° C., preferably from about from about 170° C. to about 190° C. for about 1 minute to about 60 minutes, preferably from about 15 to about 30 minutes to remove any remaining solvent prior to laminating the nozzle plate 32 to the semiconductor substrate 34. Laser ablated nozzle plates 32 are attached to each of the semiconductor substrates 34 on the wafer by a heat lamination process to form a plurality of ejection heads 10. The ejection heads 10 are then excised from the wafer 42.

substrate 12 and for increasing the process window during imaging and developing the planarization layer 40. The increased process window enables an increase of alignment of the mask 44 to the semiconductor substrate 34 for defining ejection head features in the planarization layer 40 for multiple ejection heads 10 on the wafer 42.

The planarization layer 40 is made from an improved photoresist formulation that is spin-coated onto the wafer 42 containing the semiconductor substrates 34. The improved photoresist formulation described herein includes one or more difunctional epoxy components, a multifunctional epoxy component, a silane adhesion enhancing agent, and a photoacid generator, a photoinitiator, a dye, and one or more solvents. A non-photoreactive solvent is used to apply the resin formulation to the surface 26 of the chip 10.

The one or more di-functional epoxy components may be selected from di-functional epoxy compounds which include diglycidyl ethers of bisphenol-A, 3,4-epoxycyclohexylmethyl-3,4-epoxycyclo-hexene carboxylate, 3,4-epoxy-6-methylcyclohexyl-methyl-3,4-epoxy-6-methylcy-clohexene carboxylate, bis(3,4-epoxy-6-methylcyclohexylmethyl) adipate, and bis(2,3-epoxycyclopentyl) ether. Representative difunctional epoxy compounds may be selected from, but not limited to, the following compounds:

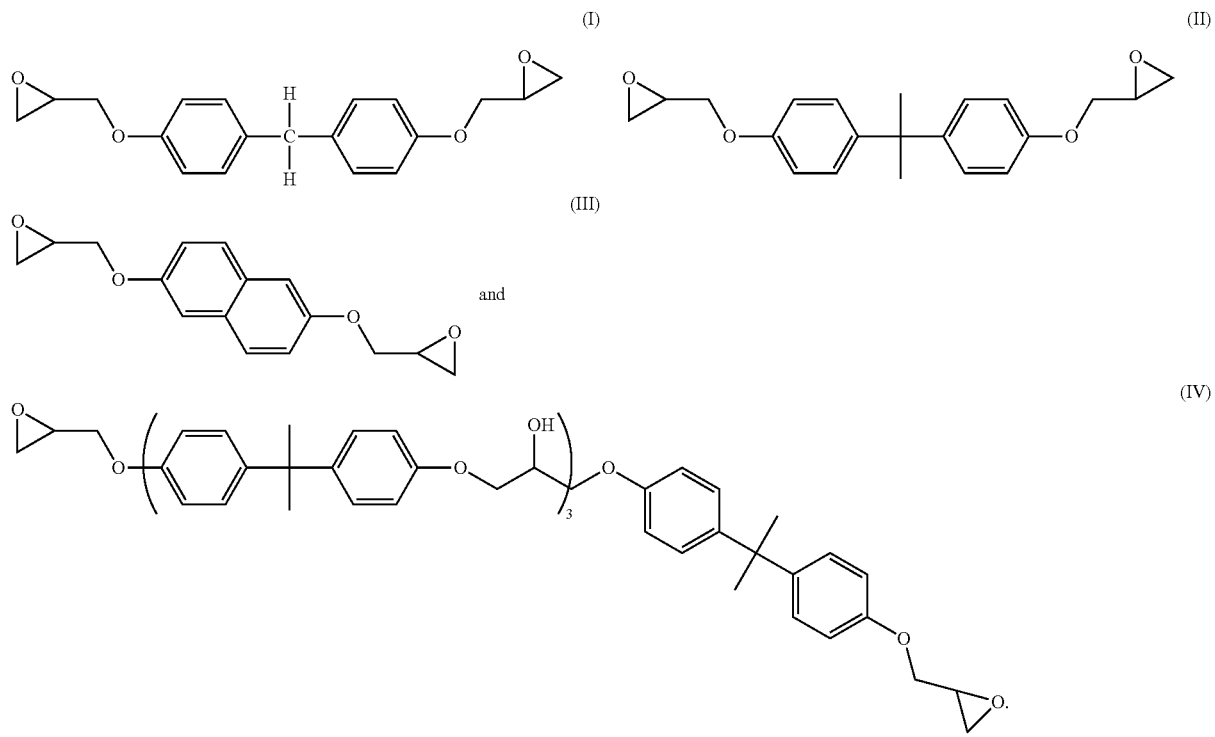

Figure 7:
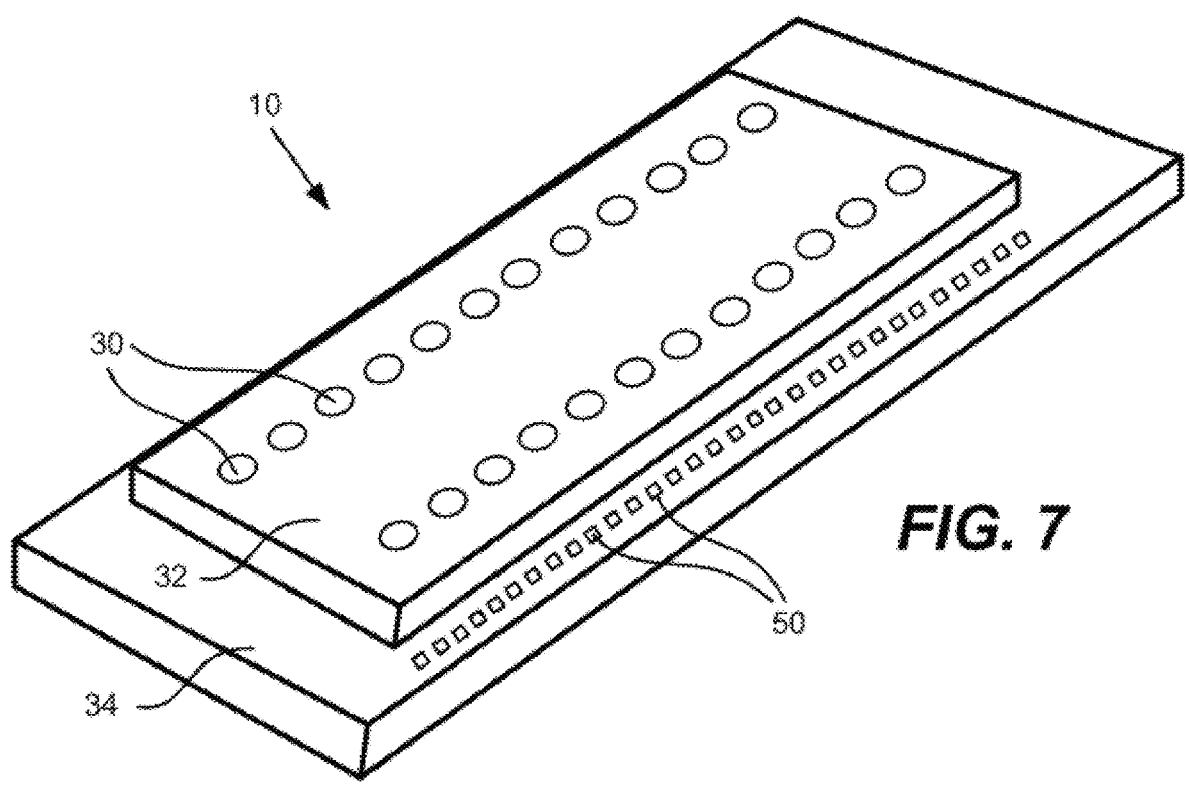
FIG. 7 is a perspective view, not to scale, of the fluid ejection head of FIG. 1.
Figure 8:
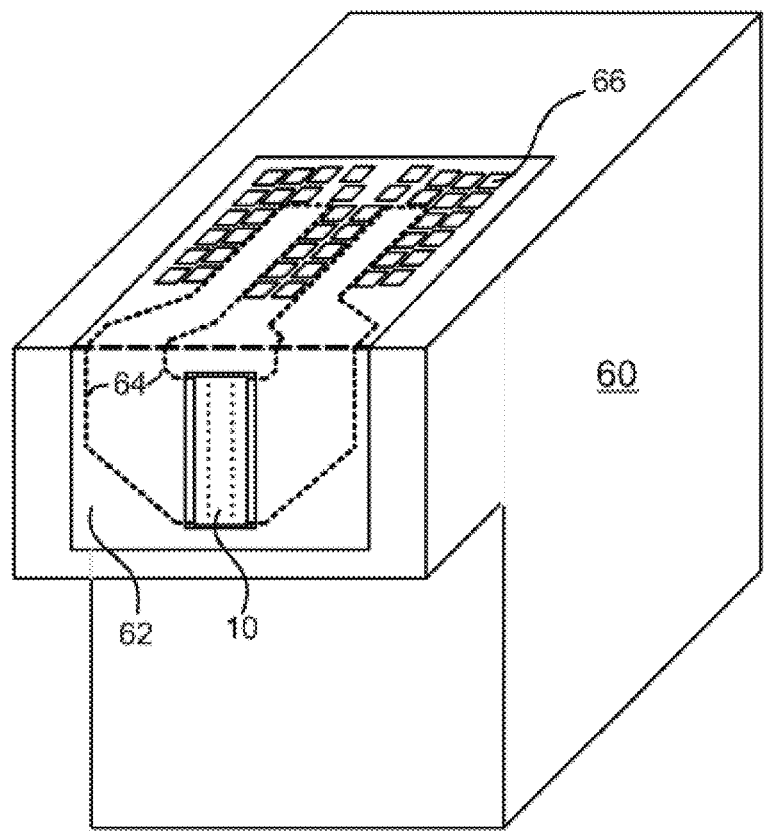
FIG. 8 is a perspective view, not to scale, of a fluid cartridge containing the fluid ejection head of FIG. 1.

A perspective view, not to scale, of an ejection head 10 excised from the wafer 42 is illustrated in FIG. 7. Each ejection head 10 may be attached to a fluid cartridge body 60 as shown in FIG. 8. A flexible circuit 62 containing electrical traces 64 and electrical contact pads 66 is attached to the bond pads 50 on the ejection head 10 for electrical control and activation of fluid ejection devices on the ejection head 10.

An important feature of the disclosed embodiments is the use of a planarization layer 40 that is effective for decreasing the metal reflectivity of the metal layers on the silicon A particularly preferred difunctional compound is a mixture of compound (III) and compound (IV) in a weight ratio of (III):(IV) ranging from about 0.05:1 to about 0.15:1. Compound (III) has an epoxy equivalent weight of about 140 grams per mole and compound (IV) has an epoxy equivalent weight ranging from about 1700 to about 2300 grams per mole.

The total amount of difunctional compound in the layer 40 devoid of solvent may range from about 35 to about 55 wt. %. In some embodiments, the amount of compound III may range from about 3.5 to about 4.6 wt. % based on a total weight of the layer 40 devoid of solvent and the amount of compound (V) may range from about 35 to about 46 wt. % based on a total weight of the layer 40 devoid of solvent.

The multifunctional epoxy component of the photoresist formulation used for planarization layer 40 may be selected from aromatic epoxides such as glycidyl ethers of polyphenols. Exemplary multifunctional epoxy compounds may be selected from, but not limited to, the following compounds:

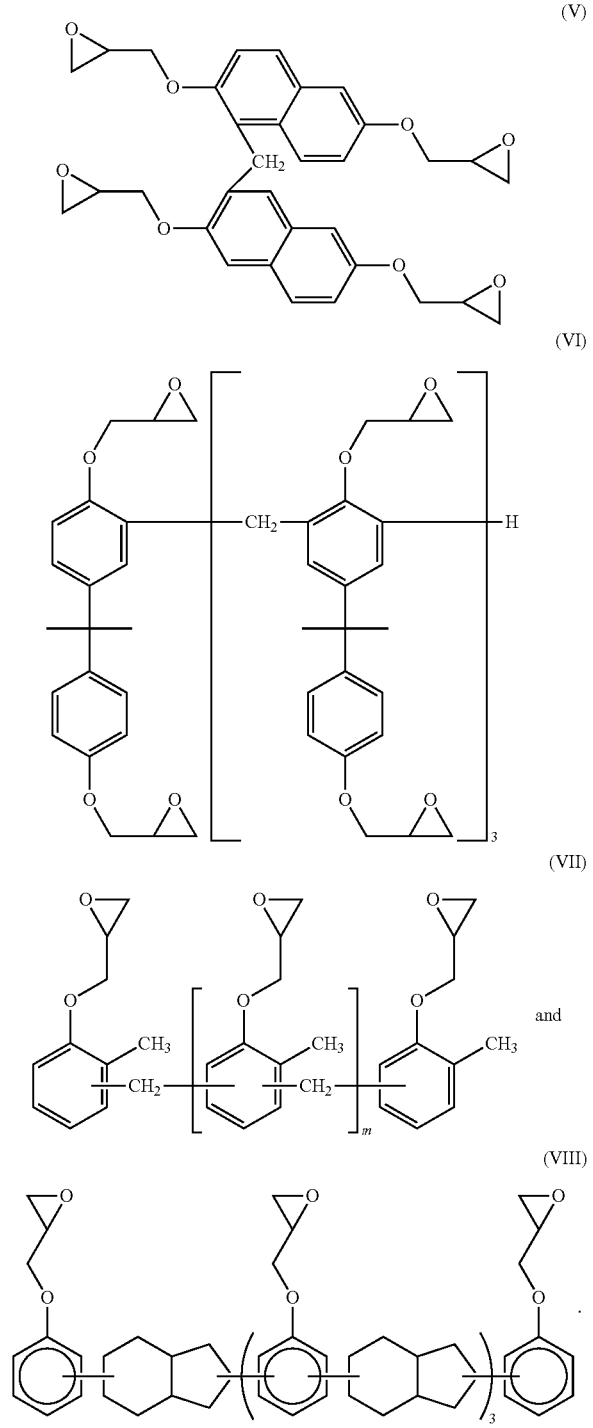

In some embodiments, the multifunctional compound is compound (VI) having an epoxy equivalent weight ranging from about 195 to about 230 grams per mole. The amount of compound (VI) in the layer 40 may range from about 35 to about 46 wt. % based on a total weight of the layer 40 devoid of solvent.

The photoresist formulation may include an effective amount of an adhesion enhancing agent such as a silane compound. Silane compounds that are compatible with the components of the photoresist formulation typically have a functional group capable of reacting with at least one member selected from the group consisting of the multifunctional epoxy compound, the difunctional epoxy compound and the photoacid generator. Such an adhesion enhancing agent may be a silane with an epoxide functional group such as 3-(guanidinyl)propyltrimethoxysilane, and a glycidoxyalkyltrialkoxysilane, e.g., gamma-glycidoxypropyltrimethoxysilane. The amount of silane compound present in the photoresist formulation may range from about 1.0 to about 2.5 weight percent, such as from about 1.5 to about 2.1 weight percent based on total weight of the layer 40 devoid of solvent, including all ranges subsumed therein.

In order to image and develop the photoresist formulation used as the planarization layer, a photoacid generator, and optionally an initiator may be used. The photoacid generator is a compound or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in the layer 40 devoid of solvent in an amount ranging from about 7 to about 10 weight percent and suitably from about 8.0 to about 8.5 weight percent based on the weight of the layer 40.

Compounds that generate a protic acid when irradiated by active rays that may be used as the photoacid generator include, but are not limited to, aromatic iodonium complex salts and aromatic sulfonium complex salts. Examples include di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, triphenyl sulfonium triflate, triphenylsulfonium hexafluorophosphate, triphenylsulfonium hexafluoroantimonate, triphenyl-sulfonium tetrakis(pentafluorophenyl)borate, 4,4'-bis[diphenylsulfonium]diphenylsulfide, bis-hexafluorophosphate, 4,4'-bis[di([beta]-hydroxyethoxy)phenyl sulfonium]diphenylsulfide bis-hexafluoroantimonate, 4,4'-bis[di([beta]-hydroxyethoxy)(phenyl sulfonium)diphenylsulfide-bishexafluorophosphate 7-[di(p-tolyl)sulfonium]-2-isopropylthioxanthone hexafluorophosphate, 7-[di(p-tolyl)sulfonio-2-isopropylthioxanthone hexafluoroantimonate, 7-[di(p-tolyl)sulfonium]-2-isopropyltetrakis(pentafluorophenyl)borate, phenylcarbonyl-4'-diphenyl sulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenyl sulfide hexafluorophosphate, 4-tert-butylphenylcarbonyl-4'-diphenylsulfonium diphenyl sulfide hexafluoroantimonate, 4-tert-butylphenylcarbonyl-4'-diphenylsulfonium diphenyl sulfide tetrakis(pentafluorophenyl)borate, diphenyl [4-(phenylthio)phenyl]sulfonium hexafluoro-antimonate and the like.

The optional photoinitiator may be selected from a thioxanthone or an alkyl or aryl substituted thioxanthone compound. Suitable alkyl substituted thioxanthone compounds include, but are not limited to, butylthioxanthone, 2-Phenyl-thioxanthone, 2-benzylthioxanthone, 2-cyclo-hexylthioxanthone, 4-isopropylthioxanthone, 2-acetylthioxanthone, thioxanthone, 2-methylthioxanthone, 2-ethylthioxanthone, and the like. The amount of thioxanthone compound in the layer 40 devoid of solvent may range from about 2.5 to about 3.5 wt. %.

Various dyes and pigments may be added to the photoresist formulation for the planarization layer 40 to decrease the metal reflectivity during the imaging process for the planarization layer 40. The dye that may be included in the photoresist formulation is not particularly limited. Specific examples of dye include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt, and a metal thiolate complex. A particularly suitable dye is a powdered green metal complex dye. The amount of green metal complex dye in the layer 40 devoid of solvent may range from about 0.35 to about 0.5 wt. %.

In order to form the planarization layer 40, the photoresist formulation typically includes a solvent to provide a formulation that can be used for spin-coating the substrates 34 on the wafer 42. A suitable solvent is a solvent which is preferably non-photoreactive. Non-photoreactive solvents include, but are not limited gamma-butyrolactone, $C_{1-6}$ acetates, tetrahydrofuran, low molecular weight ketones, mixtures thereof and the like. A particularly preferred non-photoreactive solvent is a mixture of gamma-butyrolactone and acetophenone. The non-photoreactive solvent is present in the formulation mixture used to prepare the planarization layer 40 in an amount ranging of from about 40 to about 70 weight percent, preferably from about 45 to about 65 weight percent, based on the total weight of the photoresist formulation. The non-photoreactive solvent preferably does not remain in the cured planarization layer 40 and is thus removed prior to or during the curing step for the planarization layer 40.

In order to demonstrate the unexpected improvements provided by the planarization layer according to the disclosure, the following non-limiting examples are provided. Semiconductor substrates 34 were coated with a prior art planarization material according to a prior art photoresist formulation and with an improved planarization material according to an improved photoresist formulation as provided in Table 1.

TABLE 1

| Component | Prior Art Formulation 1 | Prior Art Formulation 2 | Improved Formulation |
|---|---|---|---|
| Photoacid generator | 6.21 wt. % | 2.94 wt. % | 8.25 wt. % |
| Photoinitiator | 4.14 wt. % | 6.30 wt. % | 2.89 wt. % |
| Powdered green metal complex Dye | 0.83 wt. % | 0.63 wt. % | 0.41 wt. % |
| Multifunctional epoxy component (Formula VI) | 41.42 wt. % | 42.03 wt. % | 41.25 wt. % |

TABLE 1-continued

| Component | Prior Art Formulation 1 | Prior Art Formulation 2 | Improved Formulation |
|---|---|---|---|
| Difunctional epoxy component (Formula IV) | 41.42 wt. % | 42.03 wt. % | 41.25 wt. % |
| Difunctional epoxy component (Formula III) | 4.14 wt. % | 4.20 wt. % | 4.12 wt. % |
| Silane enhancing adhesion agent | 1.84 wt. % | 1.87 wt. % | 1.83 wt. % |

Figure 9:
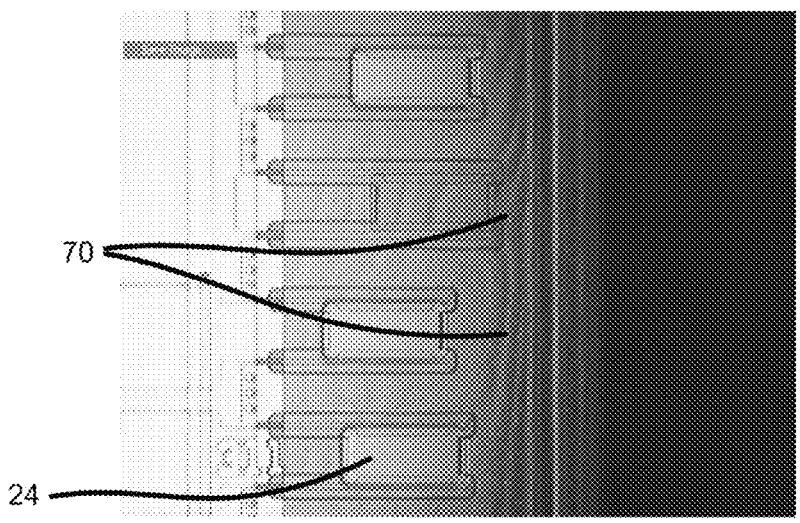
FIG. 9 is a photomicrographic image, in plan-view, of a portion of a prior art fluid ejection head
Figure 10:
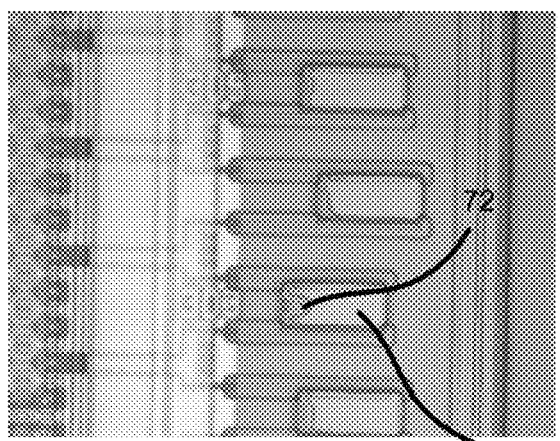
FIGS. 10-11 are photomicrographic images, in plan-view, of portions of a prior art fluid ejection head.
Figure 11:
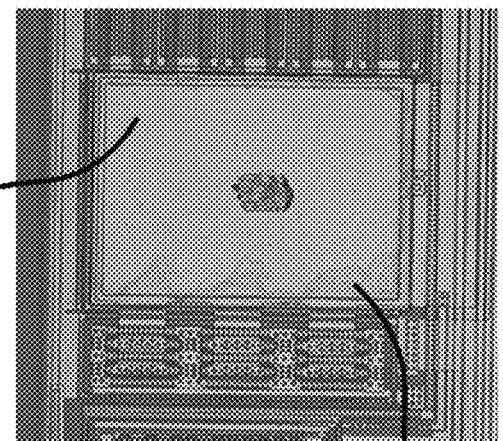
Figure 12:
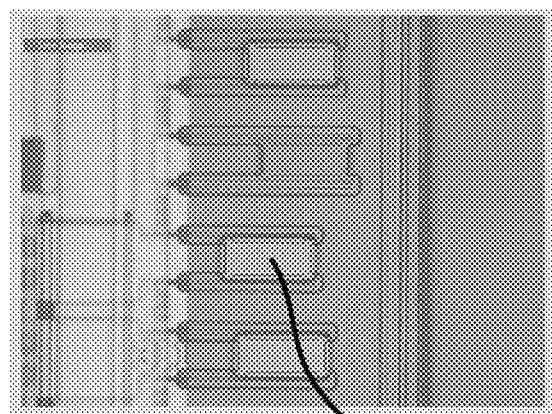
FIGS. 12-13 are photomicrographic images, in plan-view of portions of a fluid ejection head according to the disclosure.
Figure 13:
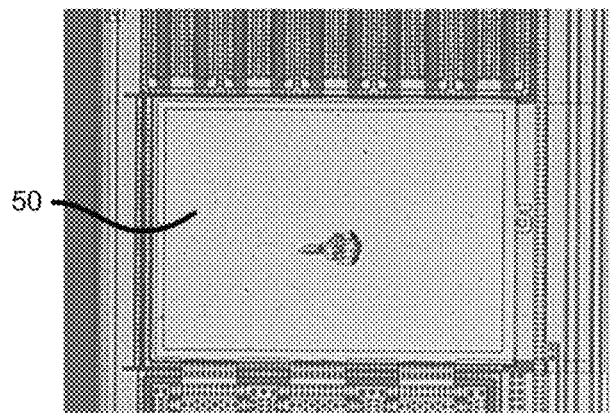

Prior art planarization materials and the improved planarization material were imaged and developed to provide the fluid ejector locations and bond pad locations in the respective planarization layers. Plan views of the imaged and developed planarization layers for the prior art formulations 1 and 2 are shown in FIGS. 9 and 11. As shown in FIG. 9 (Prior Art Formulation 1), there is wrinkling 70 of the planarization layer 40 due to underexposure with an increase in the amount of green dye in the formulation. For Prior Art Formulation 2, FIG. 10 illustrates overexposure of the planarization layer 40 resulting in incomplete imaging and development of the planarization layer over the fluid ejectors as indicated by the material 72 remaining over the fluid ejector 24. Likewise, overexposure of the planarization layer 40 over the bond pads 50 results in excess planarization material 74 remaining on the bond pad 50 for Prior Art Formulation 2. However, as shown in FIGS. 11 and 12, the improved formulation provided significantly improved removal of the planarization material over the fluid ejectors 24 and bond pad 50. The increase in photoacid generator and decrease in green dye for the improved formulation provides a surprising and unexpected decrease in the reflectivity of the metal during the imaging process.

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. A planarization layer for a fluid ejection head, planarization layer having a thickness ranging from about 2 to about 3 microns, comprising from about 8.0 to about 8.5 wt. % photoacid generator based on a total weight of the layer devoid of solvent; from about 2 to about 3.6 wt. % photoinitiator based on a total weight of the layer devoid of solvent; from about 0.35 to about 0.5 wt. % green dye based on a total weight of the layer devoid of solvent; from about 35 to about 46 wt. % multifunctional epoxy compound based on a total weight of the layer devoid of solvent; from about 35 to about 50 wt. % of one or more difunctional epoxy compounds based on a total weight of the layer devoid of solvent; and from about 1 to about 2.6 wt. % silane adhesion promoter based on a total weight of the layer devoid of solvent.

2. The planarization layer of claim 1, wherein the one or more difunctional epoxy compounds are selected from the group consisting of compounds of the formulas:

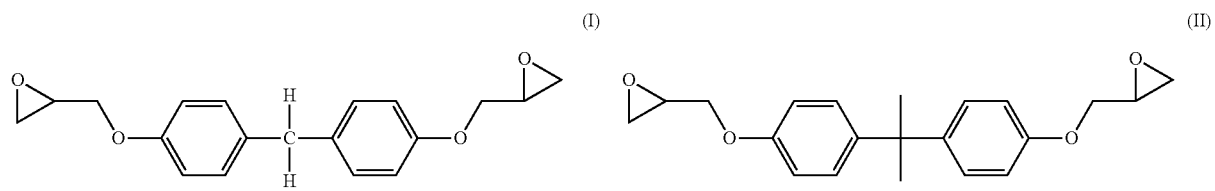

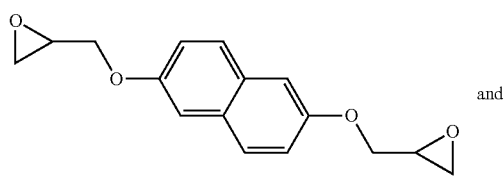
(III)

and

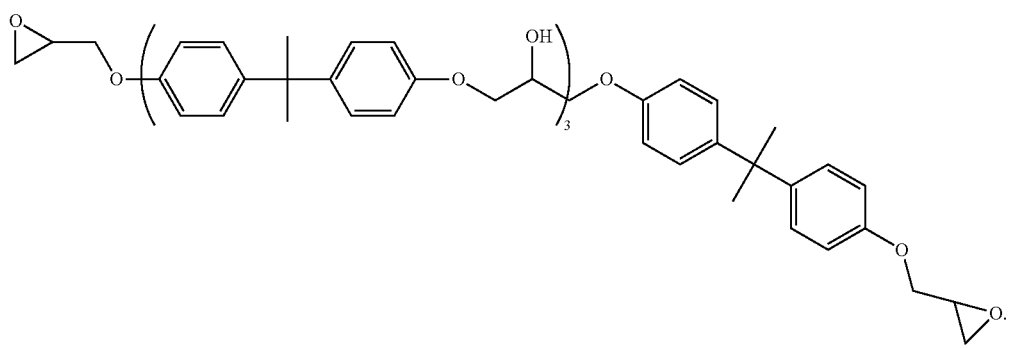
(IV)

3. The planarization layer of claim 1, wherein the multifunctional epoxy compound is selected from the group consisting of compounds of the formulas:

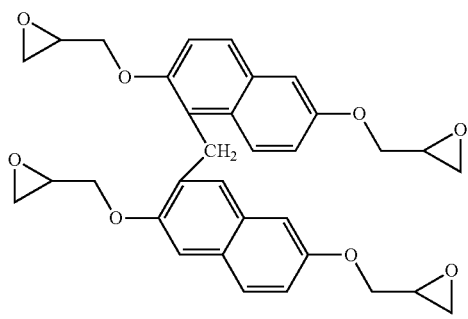
(V)

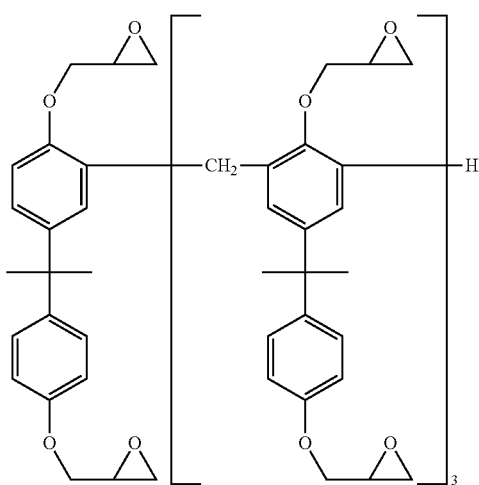
(VI)

-continued

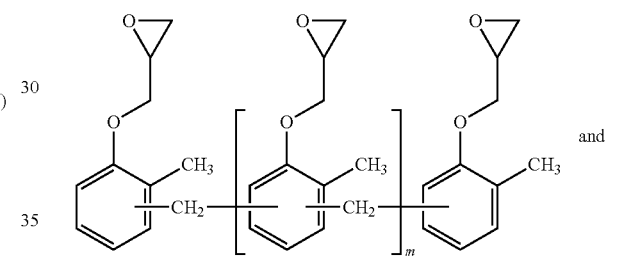
(VII)

and

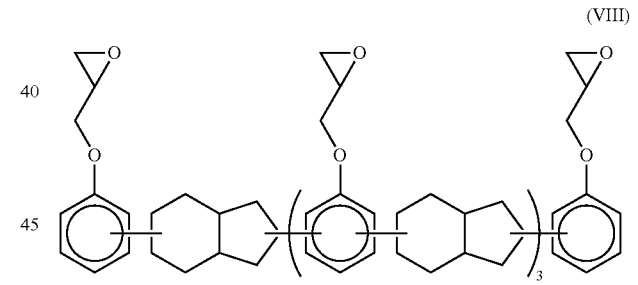
(VIII)

wherein m, n, and p are integers representing the number of repeat units in each of the polymers.

4. The planarization layer of claim 1, wherein the one or more difunctional epoxy compounds comprises from about 3.5 to about 4.6 wt. % based on a total weight of the layer devoid of solvent of a compound of the formula:

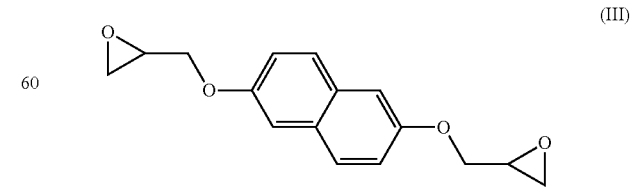
(III)

wherein the compound of formula (III) has an epoxy equivalent weight of about 140 grams per mole, and from about 35 to about 46 wt. % based on a total weight of the layer devoid of solvent of a compound of the formula:

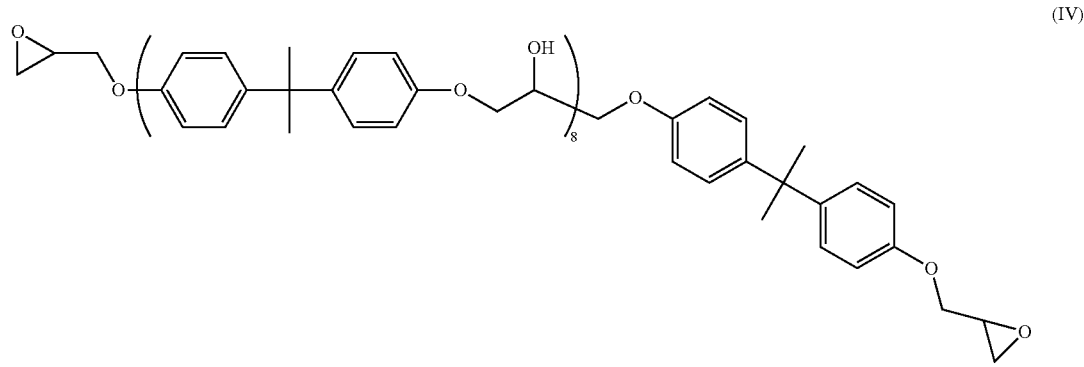

wherein the compound of formula (IV) has an epoxy equivalent weight of about 1700 to about 2300 grams per mole.

5. The planarization layer of claim 1, wherein the multifunctional epoxy compound comprises from about 35 to about 46 wt. % based on a total weight of the layer devoid of solvent of a compound of the formula:

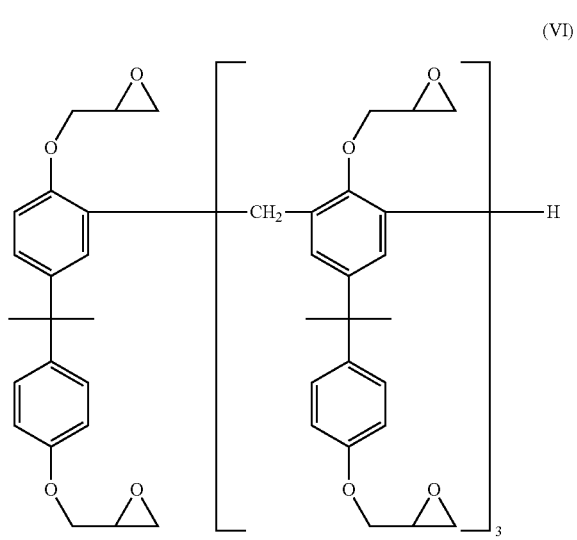

wherein the compound of formula (VI) has an epoxy equivalent weight ranging from about 195 to about 230 grams per mole.

6. The planarization layer of claim 1, wherein the silane adhesion promoter comprises 3-glycidoxypropyltrimethoxysilane.

7. The planarization layer of claim 1, wherein the green dye comprises a powdered green metal complex dye.

8. The planarization layer of claim 1, wherein the photoinitiator comprises 2-isopropylthioxanthone.

9. The planarization layer of claim 1, wherein the photoacid generator comprises a compound or mixture of compounds capable of generating a cation such as an aromatic complex salt which may be selected from the group consisting of onium salts of a Group VA element, onium salts of a Group VIA element, and aromatic halonium salts.

10. A method for planarizing a semiconductor chip for a fluid ejection head, comprising spin-coating a photoresist formulation onto a device surface of the semiconductor chip to provide a planarization layer having a thickness ranging from about 2 to about 3 microns;

drying the planarization layer to remove solvent therefrom;

exposing the planarization layer to actinic radiation through a mask;

developing the exposed planarization layer in order to define fluid ejector locations in the planarization layer;

baking the developed planarization layer to cure the planarization layer, wherein the photoresist formulation comprises from about 3.5 to about 4.5 wt. % photoacid generator based on a total weight of the formulation; from about 0.8 to about 1.8 wt. % photoinitiator based on a total weight of the formulation; from about 0.15 to about 0.25 wt. % green dye based on a total weight of the formulation; from about 15 to about 20 wt. % multifunctional epoxy compound based on a total weight of the formulation; from about 15 to about 25 wt. % one or more difunctional epoxy compounds based on a total weight of the formulation; from about 0.5 to about 1.3 wt. % silane adhesion promoter based on a total weight of the formulation; and the balance solvent.

11. The method of claim 10, wherein the one or more difunctional epoxy compounds are selected from the group consisting of compounds of the formulas:

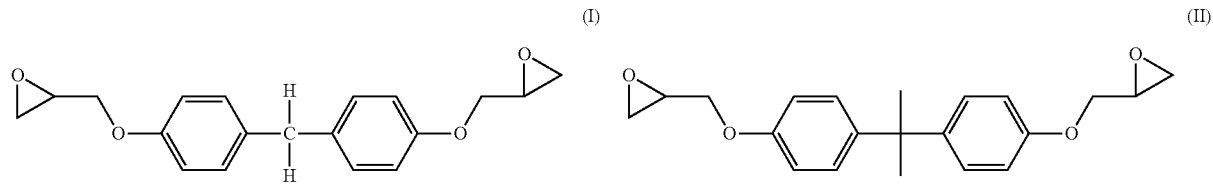

-continued (III)
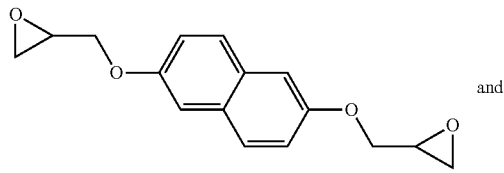

(IV)
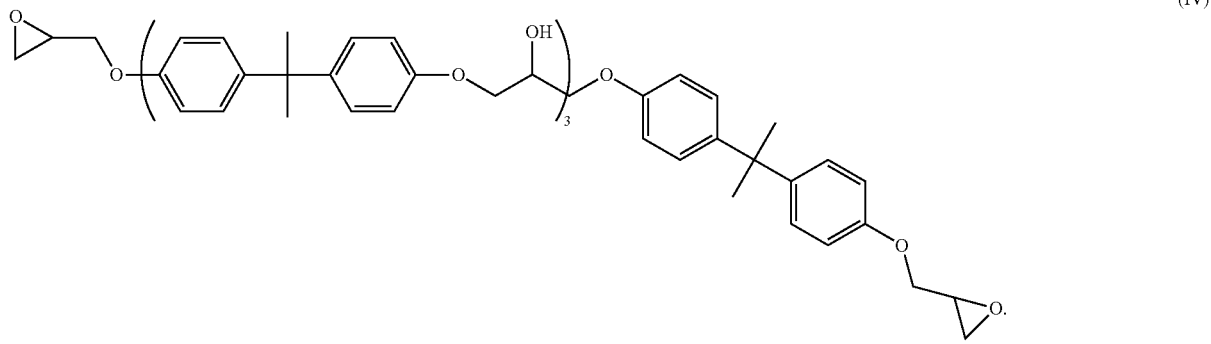

12. The method of claim 10, wherein the multifunctional epoxy compound is selected from the group consisting of compounds of the formulas:

(V)
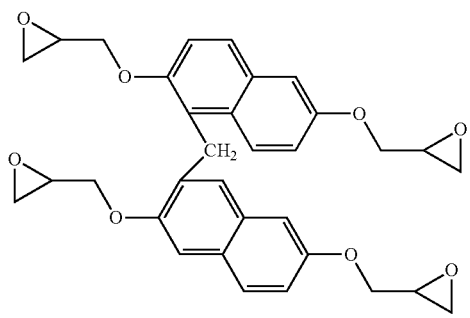

(VI)
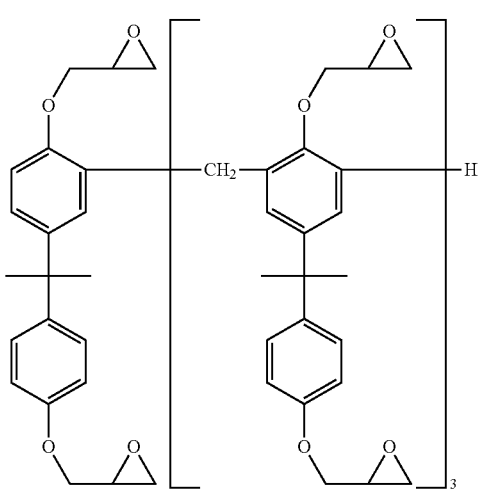

-continued (VII)
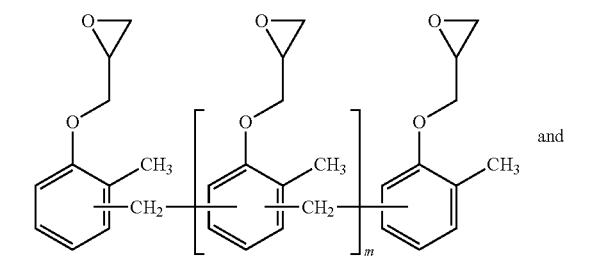

and (VIII)
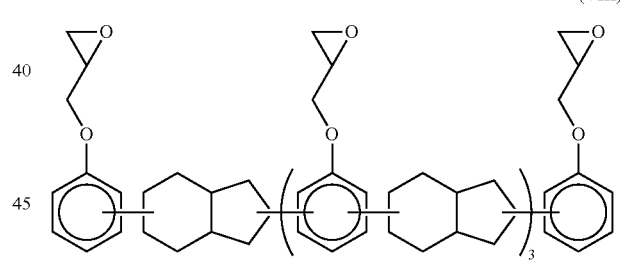

wherein m, n, and p are integers representing the number of repeat units in each of the polymers.

13. The method of claim 10, wherein the one or more difunctional epoxy compounds comprises a compound of the formula:

(III)
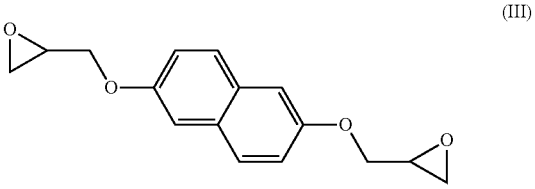 [SMILES: c1cc2cc(OCC3CO3)ccc2cc1OCC1CO1]

wherein the compound of formula (III) has an epoxy equivalent weight of about 140 grams per mole, and a compound of the formula:

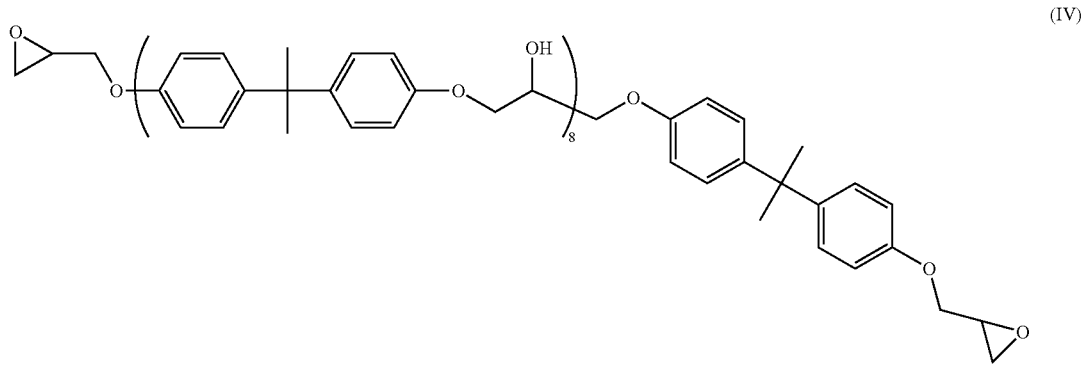

wherein the compound of formula (IV) has an epoxy equivalent weight of about 1700 to about 2300 grams per mole.

14. The method of claim 10, wherein the multifunctional epoxy compound comprises a compound of the formula:

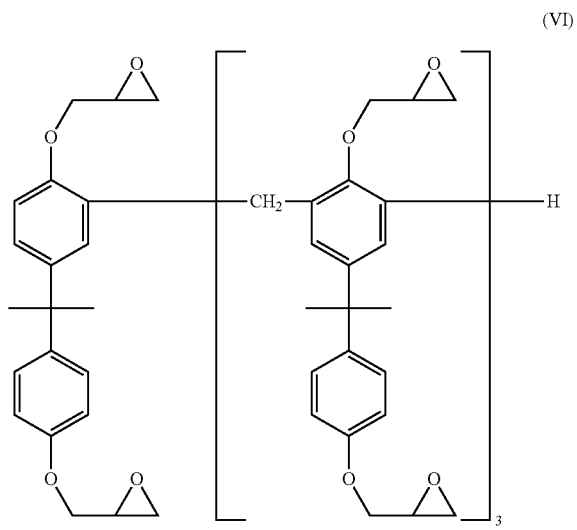

wherein the compound of formula (VI) has an epoxy equivalent weight ranging from about 195 to about 230 grams per mole.

15. The method of claim 10, wherein the silane adhesion promoter comprises 3-glycidoxypropyltrimethoxysilane.

16. The method of claim 10, wherein the green dye comprises a powdered green metal complex dye.

17. The method of claim 10, wherein the photoinitiator comprises 2-isopropylthioxanthone.

18. The method of claim 10, wherein the photoacid generator comprises a compound or mixture of compounds capable of generating a cation such as an aromatic complex salt which may be selected from the group consisting of onium salts of a Group VA element, onium salts of a Group VIA element, and aromatic halonium salts.

19. The method of claim 10, wherein the solvent is selected from the group consisting of gamma-butyrolactone, acetophenone, and mixtures thereof.

20. A semiconductor chip for a fluid ejection head comprising a planarization layer made by the method of claim 10.

* * * * *